United States Patent [19]

Numata et al.

[11] Patent Number: 5,179,049

[45] Date of Patent: Jan. 12, 1993

[54] HEAT TREATING APPARATUSES FOR SEMICONDUCTORS AND HIGH PURITY SILICON CARBIDE PARTS FOR THE APPARATUSES AND A METHOD OF MAKING THEREOF

[75] Inventors: Hideji Numata, Takasago; Takuro Ono, Yokohama; Nobuo Kageyama; Koji Furukawa, both of Takasago; Ryuhei Makimura, Toyama, all of Japan

[73] Assignees: Asahi Glass Company Ltd.; Pacific Rundum Company Ltd., both of Tokyo, Japan

[21] Appl. No.: 794,945

[22] Filed: Nov. 20, 1991

[30] Foreign Application Priority Data

Nov. 20, 1990 [JP] Japan ................................. 2-312868

[51] Int. Cl.$^5$ ............................................. C04B 35/56
[52] U.S. Cl. .......................................... 501/88; 264/60
[58] Field of Search ........................ 501/88; 432/253; 264/60, 63, 66

[56] References Cited

U.S. PATENT DOCUMENTS 4,753,763 6/1988 Tanaga et al. .................. 264/62
4,836,965 6/1989 Hayashi et al. ................. 264/60

FOREIGN PATENT DOCUMENTS 54-10825 5/1979 Japan .
55-158622 12/1980 Japan .
63-257218 10/1988 Japan .
1-282152 11/1989 Japan .
1-282153 11/1989 Japan .

OTHER PUBLICATIONS

Chemical Abstracts, vol. 11, No. 16, Oct. 16, 1989, 139373C, H. Watanabe, et al., "Manufacture of Silicon Carbide Jig for Diffusion Furnace for Semiconductor Preparation".

"Determination of Impurities in a High Purity Silicon Carbide by Pressurized Decomposition-ICP Emission Spectral Analysis", Proceedings of the 51st Symposium of the Japan Society for Analytical Chemistry, May 14, 1990, Kageyama, et al.

*Primary Examiner*—Karl Group
*Assistant Examiner*—Chris Gallo
*Attorney, Agent, or Firm*—Oblon, Spivak, McClelland, Maier & Neustadt

[57] ABSTRACT

High purity silicon carbide parts for a heat treating apparatuses for semiconductors; composed mainly of α-type silicon carbide and silicon; characterized in that a particle sizes of the α-type silicon carbide crystals composing the high purity silicon carbide parts are not larger than 44 μm; a weight mean particle size of the α-type silicon carbide crystals is in a range from 2 to 25 μm; high purity silicon is filled up among the particles of the α-type silicon carbide crystals; and a content of iron as an impurity element contained in the high purity silicon carbide parts is not larger than 5 ppm.

7 Claims, No Drawings

HEAT TREATING APPARATUSES FOR SEMICONDUCTORS AND HIGH PURITY SILICON CARBIDE PARTS FOR THE APPARATUSES AND A METHOD OF MAKING THEREOF

This invention relates to heat treating apparatuses such as a diffusion furnace and a CVD furnace, utilized in steps of surface oxidation of silicon wafers, diffusion of doping elements and thin film forming in the production process of semiconductor devices, and high purity silicon carbide parts such as a liner tube, a process tube, a boat, a cantilever, and a susceptor or the like for the heat treating apparatuses and a method of making thereof.

In the heat treating process of semiconductors, impurity elements contained in the parts of heat treating apparatuses contaminate heat-treated silicon wafers or semiconductor devices and generate faults on them, which causes to low yield of the product.

In order to prevent the contamination by impurities, thereby promoting the yield rate of the product, high purity quartz glass parts or high purity silicon carbide parts are integrated in the heat treating apparatuses of semiconductors.

Quartz glass has conventionally been used as material for parts for heat treating apparatuses, since high purity quartz glass can easily be produced. However the quartz glass has shortcomings wherein when the service temperature is elevated above 1,100° C., it softens, warps, devitrifies (crystallize) and cracks are generated in it, being easily damageable since the bending strength thereof is as small as about 6 kg/mm², and the life thereof is short.

On the other hand, in case of silicon carbide, although high purity such as quartz glass has not been obtained, it has excellent properties wherein it is stable under elevated temperature above 1,200° C., the bending strength thereof at room temperature or at elevated temperature is as large as more than 20 kg/mm², is hardly deformed and damaged, and the life thereof is long.

A production method of a conventional sintered body made of silicon carbide, which is utilized in parts for a diffusion furnace or the like, is composed mainly of α-type silicon carbide (hereinafter α-SiC) and silicon and is disclosed, for instance, in Japanese Examined Patent Publication No. 10825/1979.

Since the α-SiC powder is widely used as abrasive, the powder classified in a narrow particle size range is on sale. As α-SiC raw material for the parts made of silicon carbide, a powder having green color and high purity is selected and utilized.

The α-SiC is particularly excellent in corrosion resistance against corrosive substance such as hydrofluoric acid, hydrochloric acid, nitric acid, as well as mixed acid of these.

This property is fully utilized in refining the α-SiC powder. As described in Japanese Unexamined Patent Publication No. 158622/1980, the raw α-SiC powder is highly purified by washing with mixed acid of hydrofluoric acid and nitric acid, and then with pure water.

According to this method, the α-SiC raw material powder having an impurities level of 15 ppm can be obtained. The α-SiC powder refined to this level is utilized in the production of silicon carbide parts for the diffusion furnace.

However as an integration degree of semiconductor devices such as an LSI (large scale integrated circuit) or a VLSI (very large scale integrated circuit) increases, the influence of contamination on the yield rate of the semiconductor devices increases. Therefore there is a strong request to use parts of high purity, and free of contamination by the impurity elements.

As a countermeasure for these problems, a method of preventing the contamination of the products by the impurity elements is disclosed in Japanese Unexamined Patent Publication No. 257218/1988 or in Japanese Unexamined Patent Publication No. 282152/1989, wherein a high purity dense film coat of silicon carbide is formed on the surface of the silicon carbide parts, by a CVD (chemical vapor deposition) method, and the film coat is utilized as a barrier against the diffusion of the impurities thereby preventing the contamination of products by impurity elements.

Although this method is effective, it is difficult to completely prevent diffusion of the impurities contained in the silicon carbide parts, since it is not easy to form a film coat having no pin holes, and peeling off of the film coat may be caused.

Furthermore, the impurity elements in the interior of the CVD apparatus, may be picked up in the CVD film coat. Therefore, it is still an urgent need to solve the problem of lowering the yield rate of the products by the contamination by the impurity elements in the production of LSI or VLSI.

It is an object of the present invention to provide high purity silicon carbide parts for heat treating apparatuses of semiconductors, which do not contaminate wafers or semiconductor devices due to the impurity elements in the silicon carbide parts for heat treating apparatuses such as semiconductor diffusion furnaces or the like, and which can further promote the yield rate of the products.

According to an aspect of the present invention, there are provided high purity silicon carbide parts for heat treating apparatuses for semiconductors;
composed mainly of α-type silicon carbide and silicon; characterized in that
particle sizes of the α-type silicon carbide crystals composing the high purity silicon carbide parts are not larger than 44 μm;
a weight mean particle size of the α-type silicon carbide crystals is in a range from 2 to 25 μm;
high purity silicon is filled up among the particles of the α-type silicon carbide crystals; and
a content of iron as an impurity element contained in the high purity silicon carbide parts is not larger than 5 ppm.

In a preferred embodiment of the high purity silicon carbide parts, the content of iron contained in the parts is not lager than 2.5 ppm.

As silicon carbide crystals, two crystal phases of α-SiC and β type silicon carbide (hereinafter β-SiC) are known.

Among these, the β-SiC is usually synthesized by CVD, or by a reaction between silica powder and carbon powder. In this case fine powder having comparatively high purity is obtained. When this high purity powder is utilized as raw material of a sintered body, high purity sintered parts can be obtained. It is comparatively easy to highly purify the β-SiC powder by cleaning. However since the powder particles are too fine, the forming thereof is difficult. Moreover even if it is formed, only a formed body having large porosity is obtained. Since in the case of sintering high purity silicon carbide parts without using a sintering aid almost no sintering shrinkage is caused, a sintered body having high strength can not be obtained.

Furthermore, in case of a sintered body composed of fine crystal grains and having fine pores, it is difficult to impregnate molten silicon into the sintered body.

The $\beta$-SiC is inferior to the $\alpha$-SiC with respect to the corrosion resistance against corrosive acid, and with respect to the durability thereof in case of parts for a diffusion furnace wherein iterated acid cleaning is necessary for the parts.

For this reason the $\alpha$-SiC is a more pertinent material than the $\beta$-SiC as parts for heat treating apparatuses for semiconductors.

In case of the silicon carbide parts having small iron content as an impurity, the contents of the other impurities are also small. By utilizing high purity silicon carbide parts in the heat treating apparatuses for semiconductors, it is possible to further promote the yield rate of the products of wafers or semiconductor devices which are treated in the heat treating apparatuses of semiconductors. Moreover the life of the heat treating apparatus is far better than that integrated by quartz glass parts.

The method of making high purity silicon carbide parts for heat treating apparatuses for semiconductors according to the present invention, is a method of producing silicon carbide parts composed mainly of $\alpha$-SiC crystal particles and silicon. In this process the $\alpha$-SiC material is milled and the powder is classified. A powder having particle sizes of 44 $\mu$m or below and a weight mean particle size in a range from 2 to 25 $\mu$m, is cleaned by washing with a mixed acid of hydrofluoric acid and nitric acid and pured water wherein the iron content as an impurity in the powder is made 5 ppm or below. The powder is formed by adding an organic binder, and sintered at in a range from 1,500° to 2,300° C. After that molten high purity silicon is impregnated into the sintered body.

When the raw $\alpha$-SiC material synthesized by Acheson's method is milled and classified below 44 $\mu$m, the powder particles are almost composed of single crystals of $\alpha$-SiC.

According to the present method of making high purity silicon carbide parts for heat treating apparatuses of semiconductors, the inventors found that most of impurities in the $\alpha$-SiC powder particles can be dissolved out by washing with a mixed acid of hydrofluoric acid and nitric acid and pured water, by making the particle sizes of the $\alpha$-SiC powder below 44 $\mu$m which are finer than those of conventional $\alpha$-SiC powder, thereby $\alpha$-SiC powder of high purity can be obtained.

As pured water, normally ion exchanged water or distilled water is utilized.

The concrete examples of parts for heat treating apparatuses of semiconductors according to the present invention are wafer jigs, a liner tube, a process tube, a boat, a cantilever, a susceptor and the like which are utilized in heat treating apparatuses such as an oxidation furnace, a diffusion furnace, a CVD furnace or the like.

In the conventional production method of silicon carbide parts for a diffusion furnace of semiconductors described in Japanese Examined Patent Publication No. 10825/1979, for instance, as disclosed in the embodiments, 50 weight % of $\alpha$-SiC powder having a mean particle size in a range from 0.1 to 8, and 50 weight % of $\alpha$-SiC powder having a mean particle size in a range from 30 to 170 $\mu$m are utilized as a starting $\alpha$-SiC powder. The $\alpha$-SiC powder is formed, sintered, and impregnated with molten pure silicon, and when carbon is present in the sintered body the carbon reacts with silicon, and $\beta$-SiC is produced. (This sintering process is called a reaction sintering.)

However in case of utilizing the $\alpha$-SiC powder having the conventional particle size composition, even when sufficient cleaning treatment of the $\alpha$-SiC powder or the sintered body is performed, it is found that there is a limit in the purity of the silicon carbide sintered body finally obtained.

The $\alpha$-SiC crystals utilized as a starting material, are normally synthesized by a method called Acheson's method. In Acheson's method, normally silica and petroleum coke are utilized as raw materials, and silicon carbide is synthesized by heating the mixed raw material in an indirect type electric resistance furnace at in a range from 2,200° to 2,500° C., as a result of reactions of $SiO_2$ 3C $\rightarrow$ SiC+2CO, or the like. By elevating the reaction temperature above 2,100° C., all the silicon carbide crystals become the $\alpha$-SiC which is stable in this temperature range.

The obtained $\alpha$-SiC is a massive body in which a great number of coarse crystals are bound.

In case of utilizing the massive body as raw material for the production of parts for heat treating apparatuses for semiconductors, it is milled into a powder and sieved and impurity elements including iron are dissolved in a mixed acid of hydrofluoric acid and nitric acid and refined by washing with pured water.

The investigation of the inventors reveals that the impurity elements adhered on surfaces of the powder particles which are introduced in the milling step, can be removed comparatively easily. However, the impurity picked up in the crystal boundaries or inside of the crystal particles can hardly be removed even by washing with by the mixed acid and pured water, and these residual impurities diffuse in the sintered body in steps of successive sintering or silicon impregnation and remain in the sintered body.

Accordingly, to obtain high purity silicon carbide parts of heat treating apparatuses for semiconductors having iron concentration of 5 ppm or below, it is not sufficient to simply select and utilize the pure green $\alpha$-SiC raw material. It is necessary to remove the impurity which is difficult to remove, and which is distributed at the crystal boundaries or inside of the crystals.

To recognize the fact and to establish the production method thereof, it is necessary to develop and utilize a new method of analysis, mentioned later.

After various investigations are performed, it is found that most of the impurities existing inside of the crystals adhere to surfaces of voids which are formed inside of the crystals.

It is discovered that when the $\alpha$-SiC raw material powder is crushed so that the maximum particle size thereof is 44 $\mu$m and the weight mean particle size thereof is 25 $\mu$m or below, the impurity element such as iron which exists at the crystal boundaries or inside of the crystal, are exposed on the surfaces of the crystal particles. Therefore it becomes possible to remove the impurities by washing with mixed acid and pured water.

It is possible to make the iron content to 5 ppm or below by washing with a mixed acid and pure water, by milling the $\alpha$-SiC powder below 2 $\mu$m in weight mean particle size. However the concentration of the impurity which is introduced in the raw material in crushing step, is enlarged, which requires much time in cleaning the raw material powder to an iron impurity concentration below 5 ppm.

Furthermore, when the powder particles are made fine, the green machinability of the formed body before sintering is no good. Pore structure of the sintered body becomes fine, and the impregnation of silicon becomes difficult.

Conversely, when the weight mean particle size of the α-SiC raw material powder is increased to more than 25 μm, a large part of powder can not pass through a sieve of 44 μm aperture size, and usable portion of raw material powder is decreased. Moreover, the formability of the powder, smoothness of drained face (inside of formed body) in case of drain slip casting, are lowered by which the physical properties of sintered material such as bending strength are deteriorated.

In the process of removing impurity of iron, many of the other impurity elements are also removed at the same time. Because, the mixed acid of hydrofluoric acid and nitric acid utilized in the cleaning process dissolves almost all the impurity elements and the α-SiC crystal does not incorporate almost all impurity elements as solid solution in the crystal, impurities are distributed at the crystal boundary or on the surface of the crystal.

Sophisticated caution is required in steps of forming, sintering and high purity silicon impregnating processes to prepare the parts for heat treating apparatuses for semiconductors, so that purity level of the α-SiC powder is not lowered. However the most important point is to enhance the purity level of the starting α-SiC powder.

As methods of forming the silicon carbide parts of a heat treating apparatus for semiconductors, the slip casting method, the isostatic pressing method the extrusion method or the like can be adopted, and selected depending on the shapes of the parts. In any cases, the wider the width of the particle size distribution the better the formability, and the higher the density of the formed body.

In a preferred embodiment of the production method of heat treating apparatus for semiconductors according to the present invention, the forming is performed by the drain slip casting method.

The raw α-SiC powder which is utilized in the production method of high purity silicon carbide parts according to the present invention, possesses a particle size distribution particularly suitable for the slip for the drain slip casting. The α-SiC powder has excellent properties as follows. The powder can be made into a slip which is easy to use and stable, and by adopting the drain slip casting, a formed body having higher density than that by other forming methods, is obtained. Even when the green body is thin walled, it has strength sufficient for handling and green machining. A thin walled tube having a variety of shapes, or formed parts having a long dimension, can easily be obtained. By making the particle sizes of the α-SiC powder 44 μm or below, the velocity of sedimentation of the α-SiC powder particles in the slip which is suspended in the pure water, is made small, and a formed body having small variation of the wall thickness can be obtained.

The parts obtained by the production method of high purity silicon carbide for heat treating apparatuses of semiconductors according to the present invention, has sufficiently high strength even when the parts are thin walled, by which the total weight of the heat treating apparatuses of semiconductors can be reduced and is easy to use.

In the forming of a susceptor, a boat or the like having comparatively thick walled shapes, the isostatic pressing method can favorably be used.

Furthermore, green bodies are machined to form various shapes. In this case, the raw α-SiC powder which includes coarse particles some extent, has a better machinability.

Considering the easiness to purify the raw α-SiC powder, the formability of the α-SiC powder, the machinability of formed green body and the physical property of the obtained sintered body, the particularly favorable weight mean particle size of the raw α-SiC powder, is in a range from 3 to 15 μm.

The content of high purity silicon which is impregnated in the pores of the sintered body is preferably more than 7 weight %, since when the porosity of the sintered body is less, closed pores increase, which makes the impregnation of molten silicon difficult.

The desirable physical property such as high bending strength can be obtained by making the silicon content of the sintered body below 35 weight %, preferably 25 weight % or below.

In the production method of the high purity silicon carbide parts for heat treating apparatuses for semiconductors of the present invention, since the sintering is performed without a sintering aid, the sintering proceeds with a mechanism mainly of surface diffusion or evaporation and condensation. Therefore an inter-particle distance does not shrink, and almost no sintering shrinkage takes place. Accordingly, it is necessary to obtain a formed body of high density to obtain a dense sintered body.

As the organic binders, phenol aldehyde resin, polyvinyl acetate emulsion, acrylate resin emulsion and the like can favorably be utilized. When the phenol aldehyde resin is utilized as a binder, carbon is deposited in the sintered body. This carbon reacts with silicon and both are transformed into β-SiC in the step of silicon impregnation.

In the sintering step of the formed body composed of the α-SiC powder, it is only required to obtain a strength of the sintered body sufficient for the handling in the successive step of silicon impregnation. Therefore the sintering temperature can be lowered. Thus sufficient strength for handling can be obtained by sintering a formed body at 1,500° C. or above.

However, when the binder such as the phenol aldehyde resin, which deposits much carbon is utilized, the sintering temperature can be lowered to about 1,000° C.

When the sintering is performed at above 2,100° C., crystal growth (recrystallization) is caused, and the micro structure of the sintered body is changed by the crystal growth. In this step, the property of the sintered body is gradually deteriorated. The crystal growth by elevating the sintering temperature is not significant until 2,300° C.

However, when the sintering temperature is further elevated to above 2,300° C., the crystal growth becomes significant, and weight of sintered body thereof is decreased by the evaporation of the silicon carbide content. In this case, there is a tendency to deteriolate the material strength and the fracture toughness thereof.

In the followings, a detailed explanation will be given to the present invention based on embodiments, although this invention is not restricted by these embodiments.

Purification treatments of the α-SiC powders are tried on the α-SiC powders having a variety of particle sizes. Table 1 shows the result of the analysis on the purity of the purified powder.

The α-SiC powder is put into a mixed acid of hydrofluoric acid and nitric acid (ratio: 2:1) and the mixture is stirred for 5 hours followed by decantation and washed with pured water. This operation thereof is iterated for 3 times. Fe in the powder after the respective cleaning operation is analyzed by dissolving in the boiling mixed acid of hydrofluoric acid and nitric acid. The dissolved Fe in the mixed acid is determined by a quantitative analysis using atomic absorption analysis method.

For determining the miner impurity, instead of utilizing pure reagent which is normally utilized for analysis, high purity reagent of hydrofluoric acid and nitric acid (the impurities of the respective acids are under 1 ppb) is utilized.

The weight mean particle size is defined as a value which is read at the position of 50 weight % in the accumulated weight particle size distribution graph.

TABLE 1

Particle sizes of α-SiC powders and impurity contents of iron in powders after acid cleaning (ppm)

| Particle size (μm) | 297–210 | 210–105 | 105–74 | 74–44 | 44–30 | below 30 |
|---|---|---|---|---|---|---|
| Raw material (before cleaning) | 320 | 360 | 360 | 380 | 480 | 670 |
| Acid cleaning | | | | | | |
| (once) | 12.0 | 12.8 | 13.1 | 15.5 | 16.2 | 28.5 |
| (twice) | 6.8 | 6.6 | 5.6 | 5.1 | 4.2 | 3.6 |
| (thrice) | 2.1 | 2.0 | 1.8 | 1.7 | 1.1 | 1.0 |

According to the result of analysis shown in Table 1, the α-SiC powder after milling and sieving, contains much of impurities when the particle sizes are small, and it is found that the contamination by impurity in the milling step is significant.

However, by iterating the cleaning, the content of the Fe analyzed by this analysis method settles to a constant level irrespective of the particle sizes.

Accordingly when the particle sizes of the raw material powder are fine, the content of the impurity becomes large. However, the impurity introduced in the milling step can be removed by cleaning the powder by washing with the mixed acid and pured water. However, in this analysis method of the impurity of silicon carbide based on JIS-R6124, only the impurity elements distributed on the surface of the particles are dissolved, because boiling mixed acids can not dissolve α-SiC crystals. Therefore the impurity elements distributed at the crystal boundary or inside of the crystal of the α-SiC are not dissolved and analyzed.

The result of the following investigation reveals these facts.

When the α-SiC powder particles are decomposed, and all or almost all of the impurity elements distributed inside of the powder particles can be analyzed, the true impurity content value or an analysis value which is approximately equal to the true impurity content, should be obtained.

Generally speaking, as a method of decomposing the silicon carbide crystal particles, alkali fusion is performed. However impurities originated from reagents for performing the fusion and a vessel utilized in the fusion, often hamper the determination of impurities of extremely small amount.

As a method of the decomposition to overcome these problems, the pressurized decomposition method is tried. The α-SiC powder and the mixed acid of hydrofluoric acid and nitric acid are accommodated and sealed in an corrosion resistant vessel made of PTEE resin. By heating the vessel in a pressure vessel, pressure inside of the vessel is elevated, and the decomposition of the α-SiC powder particles are accelerated.

It is possible to perform total decomposition of the α-SiC particles by applying this method. However it is found in the following investigation that by performing the decomposition with degree of more than 50%, the analyzed impurity element quantity approaches to the true content value and is saturated. Therefore the impurity content can be analyzed at high accuracy without performing the total decomposition.

First of all, the α-SiC powders which have been cleaned by washing with the mixed acid and pured water for three times are determined to have an equivalent purity by JIS analysis method as shown in Table 1, are decomposed by the pressurized decomposition method. Iron impurity element in the dissolved solution is analyzed by the atomic absorption analysis method.

Table 2 shows the result of the iron content analysis obtained wherein the pressurized decomposition method thereof is not completely performed, and the degree of the decomposition is about 50 to 60%.

TABLE 2

Impurity component of iron in α-SiC powder by Pressurized Decomposition Analysis (ppm)

| Particle size (μm) | 297–210 | 210–105 | 105–74 | 74–44 | 44–30 | below 30 |
|---|---|---|---|---|---|---|
| JIS method | 2.1 | 2.0 | 1.8 | 1.7 | 1.1 | 1.0 |
| Pressurized Decomposition method | 20.5 | 12.2 | 9.2 | 5.7 | 2.1 | 1.8 |

As shown in Table 2, the α-SiC powders contain impurity iron inside of the particles, which can not be dissolved by the conventional cleaning method utilizing the mixed acid. The larger the particle sizes of the α-SiC particles, the more the impurity iron is contained inside of the particles.

Conversely, when the maximum particle size of the α-SiC particle is decreased under a certain value, for example 44 μm, the impurity element distributed inside of the particle is exposed on the surface of the particles, which can be removed by the cleaning using the mixed acid.

The particle size of 44 μm is significantly small compared with the mean crystal size of the α-SiC as synthesized by Acheson's method.

To clarify in what state the impurity element is contained in the α-SiC powder particles, the α-SiC powder particles are investigated by an X-ray micro analyzer. It is found that the impurity elements having iron as a major component which is distributed inside of the particle, mainly adheres to the surfaces of voids inside of the crystal particles.

It can be explained from the above results that when the α-SiC powder particles are crushed to the particle size of 44 μm or below, almost all the voids inside of the crystal particles are exposed on the surface of the particles, and the impurity element can be removed by the cleaning utilizing the mixed acid.

In the above analysis, discussion is made on the iron as an impurity element. This is because that the iron is an impurity element which is the most familiar contaminating element in the process ranging from the synthesis stage of the α-SiC raw material to the production stage of parts thereby, and is one of the impurity elements which should mostly be excluded in the production process of the semiconductor devices.

EXAMPLE 1

To α-SiC powder having the iron content of 2.1 ppm, which is obtained by cleaning the α-SiC powder having a maximum particle size of 44 μm and a mean particle size of 8 μm, classified by a sieve of 325 mesh, by washing with a mixed acid of hydrofluoric acid and nitric acid (ratio: 2:1) and pured water, pured water and a water soluble phenol aldehyde resin as a binder are added, and a slip having about 80 weight % of solid concentration is obtained.

Next, the slip is flown into a long sized plaster mold. After a wall thickness of about 4 mm is formed, the slip is drained (called the drain slip casting method). A cylindrical formed body having outer diameter of 310 mm, inner diameter of 302 mm, and length of 1,780 mm is obtained.

The difference in the wall thicknesses at the top portion and the bottom portion of the formed body is as small as 0.5 mm.

The formed body is dried, and sintered in an electric furnace in an inert gas atmosphere, at 2,000° C.

Next, the sintered body is transferred to another electric furnace, in which the sintered body is impregnated with high purity molten silicon which is utilized as a raw material for semiconductor wafers. At the same time carbon which remains in the sintered body, reacts with silicon, producing silicon carbide (in this case β-SiC is produced), and a sintered body having all the pores filled with the high purity silicon, is obtained.

The sintered body, cleaned by washing with the mixed acid and pured water, is utilized as a liner tube for a semiconductor diffusion furnace.

A small chip is cut off from the sintered tube, and is analyzed by the pressurized decomposition analysis method, by which the iron content is found to be 2.2 ppm.

EXAMPLE 2

An α-SiC powder having iron content of 1.8 ppm is obtained by cleaning the α-SiC powder having a maximum particle size of 30 μm and a mean particle size of 4.5 μm, classified by a sieve specially made to order, by washing with the mixed acid of hydrofluoric acid and nitric acid (ratio: 1:2) and pured water.

This α-SiC powder is granulated by adding polyvinyl acetate water emulsion as a binder to the powder.

This granulated powder is isostatically pressed at 1,500 kg/cm$^2$, and a rod-like formed body having dimensions of 50 mm×50 mm×1,000 mm is obtained.

Next, this green formed body is machined into a columnar body having an outer diameter of 14 mm. By bonding the columnar body using the slip used in Example 1 as a bonding agent, the columnar body is formed into a boat for wafer. This green body is subjected to sintering and silicon impregnation with the same condition as in Example 1.

Then cutting is performed on the sintered body by a diamond saw wheel, and grooves of 1 mm in width are formed for retaining silicon wafers. Furthermore, it is cleaned by washing with the mixed acid and pured water, and a boat for wafers is obtained.

After cutting off a small chip from the boat for wafer, the iron content is determined by the pressurized decomposition analysis method, and is found to be 1.2 ppm.

At the same time, the contents of the other impurity elements are analyzed with the same sample solution. According to the result of the analysis, Ni content is 0.5 ppm, Cu, 0.1 ppm, Ca, 2 ppm, and Na and K, below 1 ppm, respectively.

EXAMPLE 3

To an α-SiC powder having iron content of 1.1 ppm, which is obtained by cleaning the α-SiC powder having a maximum particle size of the 44 μm and a mean particle size of 5 μm, classified by a sieve of 325 mesh, by washing with the mixed acid of hydrofluoric acid and nitric acid (ratio: 1:2) and pured water, pured water and an acrylate resin emulsion as a binder are added, and a slip having solid concentration of about 75 weight % is obtained.

The drain slip casting is performed with the slip using a plaster mold. After drying, the green formed body is machined to obtain a fork-like formed body for mounting a wafer boat.

Then the formed body is sintered in an electric furnace of an Argon gas atmosphere, at 1,900° C. The porosity of the sintered body is 18%, and the iron content thereof determined by the pressurized decomposition analysis method, is 1.0 ppm.

Next, the sintered body is put into another electric furnace, wherein molten high purity silicon is impregnated in vacuum at 1,800° C., and a sintered body having all the pores filled with the high purity silicon is obtained.

After that, the sintered body is cleaned by washing with the mixed acid and pured water. The iron content is analyzed by the pressurized decomposition analysis method as for a small chip cut off from the sintered body, and is found to be 1.1 ppm.

A test pieces is cut out from the same sintered body, and the three point bending strength is measured according to the JIS test method, which is found to be 45 kg/mm$^2$ at room temperature and 52 kg mm$^2$ at 1,200° C. The fracture toughness value or $K_{IC}$ thereof is 4.5 MN/m$^{3/2}$ at room temperature, and 7.5 MN/m$^{3/2}$ at 1,200° C.

Accordingly, it is found that the obtained sintered body has sufficient strength and reliability as a fork-like sintered body for a diffusion furnace or the like.

EXAMPLE 4

An α-SiC powder having a maximum particle size of 30 μm and a mean particle size of 6 μm obtained by classifying it with a sieve specially made to order, is cleaned by washing with the mixed acid and pured water for three times. The iron content of the α-SiC powder according to the pressurized decomposition analysis method, is found to be 1.8 ppm.

To this α-SiC powder, emulsion of polyvinyl butyral with low degree of polymerization and pured water is added and is transformed into a slip. This slip is injected into a porous urethane mold with a pressure of 3 kg/cm$^2$, and is formed into a form of wheels with a shaft.

The formed body is dried and is sintered in an electric furnace of a nitrogen gas atmosphere at 1,700° C. Next, the sintered body is transferred to another electric furnace, and the molten high purity silicon is impregnated into the sintered body in vacuum at 1,800° C., and a pair of silicon carbide wheels of a mother boat containing 31 weight % of silicon is obtained.

The iron content of the sintered body is analyzed by the pressurized decomposition analysis method, which is found to be 1.4 ppm. By investigating the physical property at 1,200° C. with test samples cut out from the shaft portion of the wheels, the bending strength is found to be 23 kg/mm$^2$, and the fracture toughness $K_{IC}$ is found to be 7.1 MN/m$^{3/2}$.

EXAMPLE 5

The α-SiC powder having a maximum particle size of 15 μm and a mean particle size of 3.3 μm which is obtained by classifying by the water sedimentation method, is cleaned with the same condition as in Example 1, and is transformed into a slip by adding pured water and dextrin as a binder.

A liner tube having substantially the same dimension with that in Example 1, is formed by drain casting method using this slip, and is sintered in a vacuum electric furnace at 2,150° C. Impregnating with molten high purity silicon, a liner tube having silicon content of 11 weight % is obtained.

The iron content in this sintered body is analyzed by the pressurized decomposition analysis method, and is found to be 0.5 ppm.

In this case the sintering temperature of the liner tube is high and the liner tube has rough surface. However a zircon insulation coat layer is well adhered to the surface of the liner tube.

EXAMPLE 6

An α-SiC powder having a maximum particle size of 15 μm and a mean particle size of 2.4 μm, which is obtained by classifying by the same method as in Example 5, is cleaned with the same condition as in Example 1, and hydroxyethyl cellulose is added as a binder, and a plastic batch is obtained.

Tubes having an outer diameter of 10 mm and an inner diameter of 7 mm are extruded using an extruder having a cylinder and a plunger, which are coated with polytetrafluoroethylene (PTFE), and are formed into a shape of protecting tubes, plugging their front end with the same batch.

The formed bodies are dried and sintered in an electric furnace of argon gas atmosphere at 1,600° C. Silane gas with hydrogen gas carrier is flown into the furnace, and silicon is impregnated into the sintered bodies.

The iron content of the obtained silicon carbide protecting tubes are analyzed by the pressurized decomposition analysis method, and is found to be 0.4 ppm.

This protecting tubes are put in a diffusion furnace, wherein the surface of the sintered bodies are oxidized and silica coats are produced on the surfaces. This protecting tubes have insulating property, and these can be utilized as protective tubes of thermocouples as they are.

EXAMPLE 7

The powder obtained in Example 1 is further classified by an air flow method to remove particles below 10 μm, and an α-SiC powder having a maximum particle size of 44 μm and a mean particle size of 20 μm is obtained.

This powder is cleaned with the same condition as in Example 1, and is mixed with a small quantity of stearic acid as a lubricant. Thus powder is press-formed at 500 kg/cm$^2$, into a plate with a dimension of 160 mm×500 mm ×6 mm.

The formed body is sintered in an electric furnace in an argon gas atmosphere at 1,550° C., and impregnating with high purity molten silicon in vacuum at 1,800° C., a planer sintered body is obtained.

This sintered body is further ground to obtain a susceptor for 6 inch wafer.

The iron content of the obtained susceptor is analyzed by the pressurized decomposition method, and is found to be 4.2 ppm. The chromium content of the susceptor analyzed at the same time is found to be 0.4 ppm.

The bending strength is measured with test samples cut off from the sintered body, and is found to be 20 kg/mm$^2$ at room temperature and 22 kg/mm$^2$ at 1,200° C.

EXAMPLE 8

An α-SiC powder having a maximum particle size of 28 μm and a mean particle size of 12 μm which is obtained by classifying by the same method as in Example 5, is cleaned with the same condition as in Example 1. The powder is added with pured water and polyvinyl alcohol as a binder to prepare a slip.

By using this slip, a tube having the same shape as in Example 1 is formed by the drain slip casting.

This formed body is dried, then pre-sintered at 850° C. to remove the binder and is sintered in an electric furnace, having nitrogen atmosphere containing hydrogen, at 1,800° C.

The sintered body is transferred to a vacuum electric furnace, and high purity molten silicon is impregnated at 1,800° C. to obtain a process tube containing silicon of about 15 weight %.

The iron content of this sintered tube is analyzed by the pressurized decomposition analysis method, and is found to be 0.9 ppm.

EXAMPLE 9

An α-SiC powder having a maximum particle size of 44 μm and a mean particle size of 12 μm which is obtained by passing through a sieve of 325 mesh, is cleaned by the same method as in Example 1, and a disk having a thickness of 6 mm and a diameter of 150 mm is formed by the same method as in Example 4.

The formed body is sintered in an electric furnace in a nitrogen gas atmosphere at 1,700° C., and the sintered body is transferred to another electric furnace to impregnate molten high purity silicon in vacuum at 1,800° C.

The iron content is analyzed with a small chip cut off from the sintered body by the pressurized decomposition analysis method, and is found to be 3.1 ppm..

This disk is ground to prepare a radiation shield, which is attached to a cantilever, and the influence on a silicon wafer is investigated. However, no influence by impurities is recognized.

COMPARATIVE EXAMPLE 1

An α-SiC powder having a maximum particle size of 297 μm and a mean particle size of 32 μm obtained by passing through a sieve of 48 mesh, is cleaned by washing with a mixed acid of hydrofluoric acid and nitric acid and pured water as in Example 1. The iron content of the powder is analyzed by the pressurized decomposition analysis method, and is found to be 17.2 ppm.

By using this α-SiC powder, a liner tube having wall thickness of about 4 mm is produced by the same method as in Example 1. Since the sedimentation velocity of the particles in the slip is large, the difference in the wall thicknesses between the top portion and the bottom portion of the tube is as large as about 1.5 mm.

Iron content is analyzed with a small chip cut off from the sintered body and is found to be 16.8 ppm. As measured with test pieces cut off from the sintered body, the three point bending strength is 18 kg/mm² at room temperature and 21 kg/mm² at 1,200° C., and the fracture toughness $K_{IC}$ is 3.1 MN/m$^{3/2}$ at room temperature and 4.0 MN/m$^{3/2}$ at 1,200° C.

COMPARATIVE EXAMPLE 2

An α-SiC powder having a maximum particle size of 105 μm and a mean particle size of 22 μm, obtained by classifying by a sieve of 150 mesh, is cleaned with the same condition as in Example 1. The iron content of the powder is analyzed by the pressurized decomposition analysis method, and is found to be 9.2 ppm.

By using this α-SiC powder, a process tube is made with the same condition as in Example 1. After cutting off a small chip from this tube, the iron content thereof is analyzed by the pressurized decomposition analysis method, and is found to be 10.5 ppm.

COMPARATIVE EXAMPLE 3

An α-SiC powder having a maximum particle size of 10 μm and a mean particle size of 0.8 μm, obtained by classifying by the water sedimentation method, is cleaned with the same condition as in Example 1, and an α-SiC powder having an iron content of 0.8 ppm is obtained.

This powder is isostatically press-formed as in Example 2, and formed into a shape of a boat for a wafer. The formed body is sintered in an electric furnace of an argon gas atmosphere at 2,000° C., and this sintered body is impregnated with molten pure silicon with the same condition as in Example 2. However, there remains a portion wherein silicon is not impregnated, and cracks are caused in the sintered body. Therefore satisfactory product is not obtained.

By limiting the maximum particle size of the raw α-SiC powder at 44 μm or below, and by specifying the mean particle size thereof in the range from 2 to 25 μm, the α-SiC powder particles are composed almost of single crystals, and most of the impurities distributed at the crystal boundary or inside of the crystals can be exposed on the surface of the particles. By cleaning this raw α-SiC powder utilizing the mixed acid of hydrofluoric acid and nitric acid and pured water, the raw α-SiC powder is refined and the iron content can be decreased to 5 ppm or below.

The sintered body which is formed, sintered, and impregnated with high purity silicon using the α-SiC powder that is refined by the specific method wherein the content of iron, the representative of impurity elements is extremely small, is a high purity material, wherein the iron content is 5 ppm or below, or 2.5 ppm or below. By using the silicon carbide parts for heat treating apparatus for semiconductors made of this high purity sintered body, or by using the heat treating apparatus for semiconductors such as a diffusion furnace, an oxidation furnace, and an CVD furnace, integrated with these parts, the yield rate and the productivity of semiconductor devices such as LSI or VLSI can further be promoted.

The high purity silicon carbide parts of the present invention have bending strengths and fracture toughnesses much larger than those of the conventional silicon carbide parts, and are hard to be fractured, having good reliability. By using thin walled parts thereof, total weights of heat treating apparatuses for semiconductors can be made small and are easy to handle, and these values of utility in the industry are great.

What is claimed is:

1. High purity silicon carbide parts for heat treating apparatuses for semiconductors comprising α silicon carbide and high purity silicon characterized in that said parts are formed from:
   an α silicon carbide powder with a particle size of not greater than 44 μm and a weight means particle size of from 2 to 25 μ;
   high purity silicon which is used to impregnate the α silicon carbide; and
   an iron impurity concentration of not greater than 5 ppm.

2. The high purity silicon carbide parts of claim 1, wherein the iron content an impurity element contained in the high purity silicon is not greater than 2.5 ppm.

3. A heat treating apparatus for semiconductors comprising high purity silicon carbide parts integrated in the high temperature portions of said apparatus, said parts comprising α silicon carbide and high purity silicon and are formed from:
   an α silicon carbide powder with a particle size of not greater than 44 μm and a weight means particle size of from 2 to 25 μm;
   a high purity silicon which is used to impregnate the α silicon carbide; and
   an iron impurity concentration of not greater than 5 ppm.

4. The heat treating apparatuses for semiconductors according to claim 3, wherein the heat treating apparatuses for semiconductors are diffusion furnaces for semiconductors.

5. The heat treating apparatus for semiconductors according to claim 3 or claim 4, wherein the content or iron is not greater than 2.5 ppm.

6. A method of making high purity silicon carbide parts suitable for use in heat treating apparatuses for semiconductors, said parts comprising α silicon carbide and silicon; comprising the steps of;
   crushing α silicon carbide into a powder having a particle size distribution such that no particles are larger than 44 μm and a weight means particle size of from 2 to 25 μm;
   cleaning by washing with a mixed acid consisting of hydrofluoric acid, nitric acid and pure water so that the iron content in the powder is not larger than 5 ppm;
   forming the powder with an organic binder into a formed body;
   sintering the formed body at a temperature in the range of from 1,500° to 2,300° C.; and
   impregnating molten high purity silicon into the sintered body.

7. The method of making high purity silicon carbide parts according to claim 6, wherein the forming step comprises drain slip casting.

* * * * *